United States Patent [19]
Pritchard et al.

[11] Patent Number: 5,369,645
[45] Date of Patent: Nov. 29, 1994

[54] TESTING INTEGRATED CIRCUIT PAD INPUT AND OUTPUT STRUCTURES

[75] Inventors: Thomas B. Pritchard; Douglas L. Franz, both of Vancouver, Wash.; Casey D. Hoekstra, Corvallis, Oreg.; Richard I. Klaus, Vancouver, Wash.

[73] Assignee: Hewlett-Packard Company, Palo Alto, Calif.

[21] Appl. No.: 724,645

[22] Filed: Jul. 2, 1991

[51] Int. Cl.⁵ .................................. H04B 17/00
[52] U.S. Cl. ..................... 371/22.1; 371/24; 371/25.1; 324/158.1
[58] Field of Search ............... 371/22.1, 24, 25.1, 371/22.3, 22.6; 365/189.05, 205; 324/158 R

[56] References Cited

U.S. PATENT DOCUMENTS

| | | | |
|---|---|---|---|
| 4,485,472 | 11/1984 | Sproull et al. | 371/15 |
| 4,703,484 | 10/1987 | Rolfe et al. | 371/25 |
| 5,003,204 | 3/1991 | Cushing et al. | 307/465 |
| 5,155,733 | 10/1992 | Blecha, Jr. | 371/22.5 |

FOREIGN PATENT DOCUMENTS 2290573 11/1990 Japan.

Primary Examiner—Robert W. Beausoliel, Jr.
Assistant Examiner—Stephen C. Elmore

[57] ABSTRACT

Digital integrated circuit testable input/output pad logic includes modified output driver logic and a latch for storing a test bit provided externally at the I/O pad terminal. The output driver logic selects either the normal pad output signal (O) for output during normal operation, or the stored test bit (S) or its complement (S') for output during a test operation. The output driver logic and latch are controlled by control logic signals (DP,SP,NDN,LS,NLS,NSN) derived from common tri-state (NTR) and latch (NTM) test signals provided externally at dedicated test pins (NTR,NTM). The control logic signals are provided over a bus to all similar testable I/O pads for testing all testable I/O pads within the IC under control of the two test signals.

4 Claims, 2 Drawing Sheets

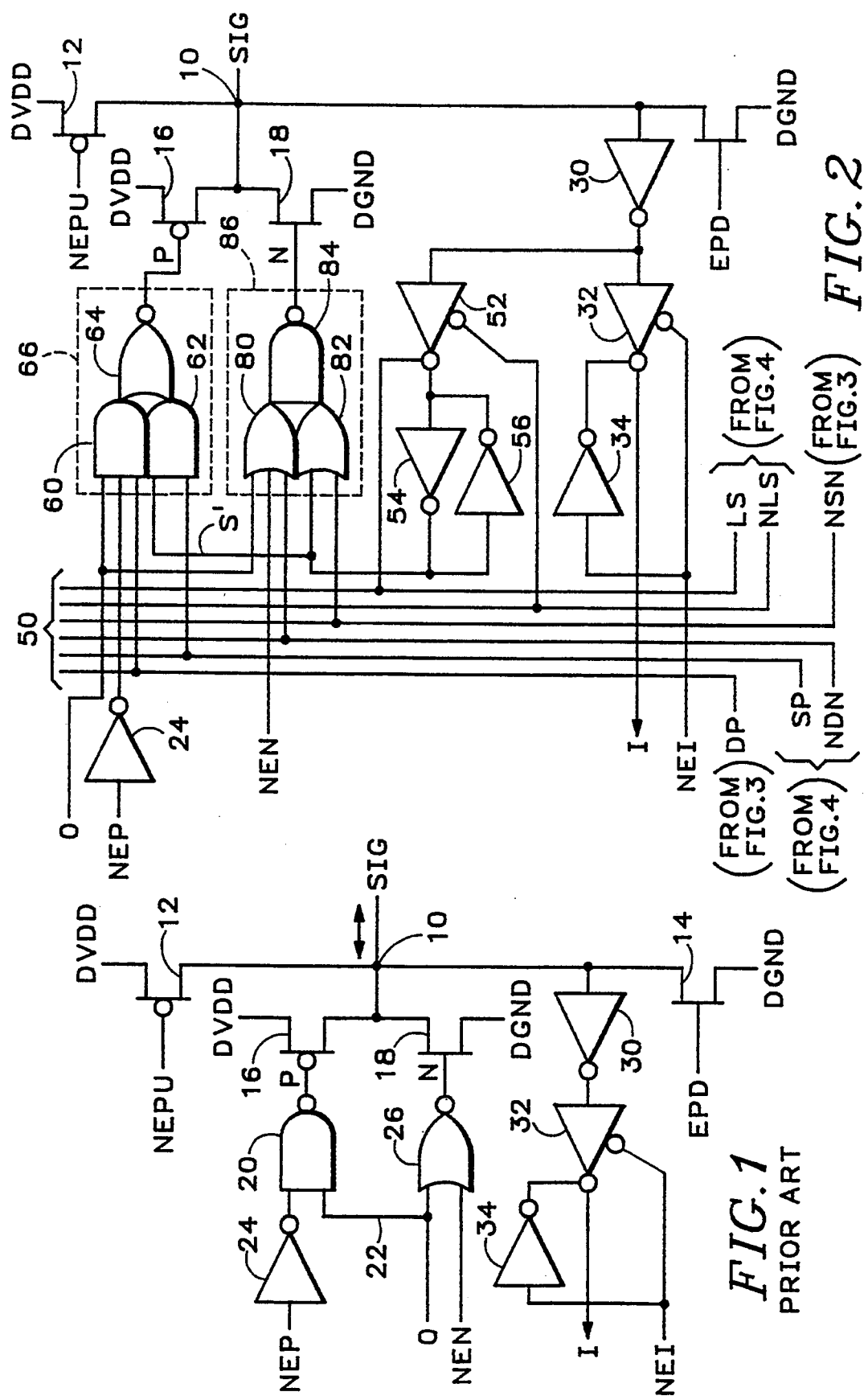

TESTING INTEGRATED CIRCUIT PAD INPUT AND OUTPUT STRUCTURES

BACKGROUND OF THE INVENTION

The present invention relates to the field of digital integrated circuits and more particularly, to testing to verify the integrity of integrated circuit terminal pad input and output structures.

While an integrated circuit (IC) may have been thoroughly tested before being assembled onto a printed circuit board, a board level test is usually still needed to verify that the IC has not been damaged during assembly, for example, by electrostatic discharge, which may destroy the logic coupled to an input/output pad. It is also necessary to test at the board level to ensure that there are no shorts or open circuits on the I/O pads.

Known methods of testing for these failures generally involve providing a complex, time consuming, set of patterns to get the logic on the pads to desired states for testing purposes. For example, it is known to provide a serial scan path through an integrated circuit device for testing purposes. A carefully designed sequence of data is driven through the serial scan path to test logic functions. What is needed is a way to test receiver and driver logic on IC pads at the board level without requiring complex test patterns.

U.S. Pat. No. 4,896,296 discloses a programmable logic device which includes provision for a logic test mode of operation. During a logic test mode, data is serially loaded into a shift register latch ("SRL"). Under the control of a special test input signal, the data in the SRL is forced onto the sense amplifier inputs. This "apparent array pattern" is then sensed through the normal output logic and read out of a device output pin. Data can then be serially clocked out of the SRL and verified against the logical output that was received on the device output pins. This is an example of one way to test output logic circuitry in an integrated circuit. This technique, however, assumes that the serial data input and output pad structures function properly. The '296 patent does not disclose how to test input functionality of the device output pin. See FIGS. 1 and 5 and the text beginning at column 5, line 63, in the '296 patent.

SUMMARY OF THE INVENTION

One object of the invention is to allow testing IC input/output pad logic without requiring complex test patterns or sequences.

Another object of the invention is to make one or more I/O pads in a digital IC readily testable at the board level.

A further object of the invention is to provide a plurality of testable I/O pads in an IC under control of only two test signal terminals.

Yet another object of the invention is to provide convenient testability in a CMOS digital IC with a minimum of added circuit area.

According to one aspect of the invention, a digital IC testable I/O pad includes modified output driver logic and a latch. In general, the logic provides for driving test data into the latch inside the pad and driving the test data back out to verify integrity of the input and output structures. Similar test logic and latches may be provided for each I/O pad as to which such testability is desired. Test operations for all testable I/O pads are controlled by two common test control signals, "tri-state" and "latch" provided externally on dedicated pins.

Each testable I/O pad latch is coupled to the terminal and responsive to the latch signal for storing a test bit provided externally at the terminal. The latch may be formed, for example, of a cross-coupled pair of inverters. The output driver logic is arranged for selecting the normal pad output signal for output during normal operation, and for selecting the complement of the stored test bit for output during a test operation. A tri-state logic gate is connected between the terminal and the latch for isolating the latch from the terminal except when latching a new test bit.

In a CMOS embodiment, the I/O pad includes complementary P and N type output driver transistors, and the output driver logic includes an AOI circuit for controlling the P-driver transistor and an OAI circuit for controlling the N-driver transistor. The AOI and OAI circuits are arranged for selecting either a normal pad output signal (O) or the inverted stored test bit (S') as an output bit responsive to the tri-state and latch test control signals. The AOI and OAI circuits are controlled by control logic signals which are derived from the tri-state and latch signals and routed to all testable I/O pads.

The AOI and OAI circuits are further arranged for turning both output driver transistors OFF responsive to the tri-state signal, thereby tri-stating the output driver circuit to allow receiving a test bit present at the terminal.

According to the invention, a test sequence includes: (1) tri-stating the output driver circuitry in all of the testable I/O pads for receiving test bits; (2) providing a test bit at each testable I/O pad terminal; (3) storing each test bit in the corresponding latch to form a latch data bit; (4) isolating the latches from the terminals; (5) inverting each of the latch data bits; (6) driving the inverted latch data bits out of the respective terminals as output bits; and (7) comparing each of the output bits to the corresponding test bit to verify integrity of the testable I/O pads.

Appropriate test apparatus for providing test bits at the IC terminal(s) will be apparent to those skilled in the art. A test apparatus for automatically providing the test bits as well as the tri-state and latch test control signals may comprise solely hardware, or a combination of hardware and software, the latter arrangement likely being better suited to automated testing and data acquisition operations. The disclosed methods and apparatus are especially useful for automated testing of ICs at board level. The disclosed testing methods are simple enough, however, to allow quickly testing a suspect part "manually" i.e. using basic bench tools and equipment.

The foregoing and other objects, features and advantages of the invention will become more readily apparent from the following detailed description of a preferred embodiment which proceeds with reference to the drawings.

BRIEF DESCRIPTION OF THE DRAWINGS AND TABLES

FIG. 1 is a schematic diagram of a typical prior art I/O (input/output) pad in a CMOS integrated circuit.

FIG. 2 is a schematic diagram of a new testable I/O pad according to the present invention.

Figure 3:
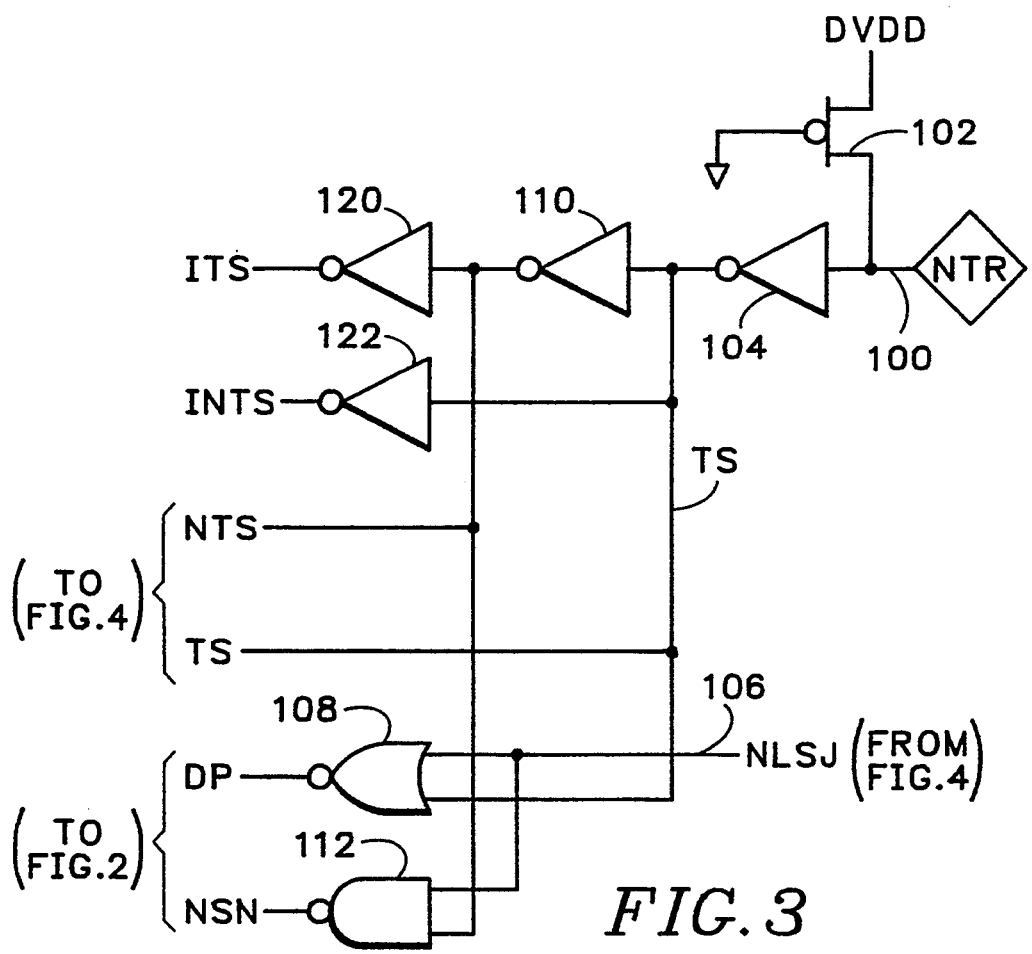
FIG. 3 is a schematic diagram of the tri-state (NTR) test control pad logic.

TABLE 1 lists the testable pad logic signals for controlling the P-driver.

TABLE 2 defines the testable pad bus logic signals.

TABLE 3 shows the testable pad bus logic signals for a typical testing sequence.

DETAILED DESCRIPTION OF THE PREFERRED EMBODIMENT

FIG. 1 is a schematic diagram of a typical prior art input/output pad in a CMOS integrated circuit. The term "pad" is used herein to include the output driver and receiver circuitry associated with a device I/O terminal. Although the invention is described in detail in a CMOS embodiment, the principles disclosed herein can be applied generally to any digital logic technology.

The I/O terminal, node 10, is connected to a device power supply signal DVDD through a pull-up transistor 12 and to a device ground DGND through a transistor 14. Transistors 12, 14 are controlled by pull-up and pull-down enable signals NEPU and EPD, respectively. (In this description, all signal names that begin with the letter N are active low.) The pad output signal (O) driver circuitry includes a P-driver transistor 16 and an N-driver transistor 18. Driver transistor 16 is controlled by a gate signal P and driver transistor 18 is controlled by a gate signal N.

The output driver logic includes the following. A NAND gate 20 combines the pad output signal O (node 22) with a P-driver output enable signal NEP to provide the P gate signal. Conversely, a NOR gate 26 combines the pad output signal O with an N-driver output enable signal NEN to provide the N gate signal. Accordingly, when the output is enabled, the P and N driver transistors drive output node 10 to the logic state of the pad output signal O.

The input, or receiver, circuitry comprises an inverter 30 having an input coupled to node 10. The output of inverter 30 is coupled through a second inverter 32 which, in turn, provides the pad input signal I. Signal I thus has the same logic state as is present at the device terminal, node 10. Inverter 32 is a tri-state device controlled by an input enable signal NEI and its complement, the latter being provided by an inverter 34, so that the output of inverter 32 is a high impedance when the pad is not in input mode.

FIG. 2 is a schematic diagram of a new testable I/O pad according to the present invention. Some of the circuitry of FIG. 2 is common to the circuitry of FIG. 1, the same reference numbers being used to refer to common elements. The common elements include the terminal node 10, pull-up and pull-down transistors, p and N driver transistors, and the receiver circuitry (30,32,34).

FIG. 2 includes a bus 50 comprising six signal lines. Bus 50 provides control signals to the new I/O pad shown, and extends to other similar testable I/O pads (not shown) so that all testable I/O pads within a single integrated circuit can be tested under the control of two test control signals, "tri-state" (NTR) and "latch" (NTM), further described below.

The new circuit includes a tri-state inverter 52, coupled through an inverter 30 so as to receive a complement of an input signal SIG applied at the I/O terminal (node 10). The output of inverter 52 is coupled to the input of an inverter 54. The output of inverter 54 is coupled to the input of another inverter 56. The output of inverter 56 is coupled back to the input of inverter 54. Cross-coupled inverters 54, 56 together form a latch for storing a bit of test data. The tri-state output of inverter 52 is enabled by complementary latch control signals NLS ("not latch S") and LS ("latch S"). These signals are derived from the latch (NTM) test signal, and provided on the bus 50. Inverter 52 isolates the latch input terminal from the input receiver (30), responsive to the latch (NTM) signal.

The logic state of the latch, i.e. the stored test bit, appears at node S. The complement of the stored test bit S, i.e. S', is provided at the output of inverter 54, and thence to the pad output driver logic. S' is subsequently read out of the device for verification. This inversion ensures that the state of the test bit read out for verification is not merely the result of capacitance that held the same data from when it was driven into the IC.

New Output Driver Logic

The usual P-driver logic, i.e. the logic that controls the P-driver transistor gate, is replaced with a first AND gate 60, a second AND gate 62, and a NOR gate 64 interconnected to form an AOI circuit 66. The usual N-driver logic is replaced by a first OR gate 80, a second OR gate 82, and a NAND gate 84, interconnected to form an OAI circuit 86. This new output driver logic provides for several functions, as follows. During normal operation, the output driver logic selects the normal pad output signal O for output to the terminal. During a test operation, the output driver logic first tri-states the I/O terminal (by disabling both P and N drivers) for receiving a test bit. After the test bit is latched, the output driver logic selects the latched test bit S (or its complement S') for output to the terminal. The output driver logic also is controlled by logic signals on bus 50.

The logic signals on bus 50 are derived as follows. The operations described above as applied to the typical I/O pad of FIG. 1 may be described in the following set of logic equations for the P-driver of the testable pad. (The treatment is analogous for the N-driver.)

The new testable pad signals are:

| | |
|---|---|
| O = | PAD OUTPUT SIGNAL |
| NEP = | P-DRIVER OUTPUT ENABLE |
| S = | DATA SAVED IN LATCH |
| P = | GATE SIGNAL ON P-DRIVER |

The new test control signals, provided externally on dedicated pins, are:

| | |
|---|---|
| NTR = | ACTIVE LOW TRI-STATE SIGNAL; TO ALLOW TEST DATA INPUT |
| NTM = | ACTIVE LOW LATCH SIGNAL; TO LATCH TEST DATA |

The logical relationships necessary to provide both the described test functions as well as normal operation of the I/O pad are shown below in Table 1 for the P-driver gate signal (P):

TABLE 1

| O | NEP | NTR | NTM | S | P | P' | |
|---|---|---|---|---|---|---|---|
| 1 | 0 | 1 | 1 | X | 0 | 1 | Normal operation |
| 0 | 0 | 1 | 1 | X | 1 | 0 | Normal operation |
| X | 1 | 1 | 1 | X | 1 | 0 | Normal op P Disabled |
| X | X | 0 | 1 | X | 1 | 0 | Tri-state |
| X | X | 0 | 0 | X | 1 | 0 | Latch test bit S |

TABLE 1-continued

| O | NEP | NTR | NTM | S | P | P' | |
|---|-----|-----|-----|---|---|----|---|
| X | X | 1 | 0 | 0 | 0 | 1 | drive inverse of latched 0 |
| X | X | 1 | 0 | 1 | 1 | 0 | drive inverse of latched 1 |

The logic equation for P, taken from the above table, is:

$$P = (O^* NEP^* NTR^* NTM) + (NEP^* NTR^* NTM) + (NTR'^* NTM) + (NTR'^* NTM') + (NTR^* NTM'^* S)$$

However, the logic equation for P' is much simpler:

$$P' = (O^* NEP'^* NTR^* NTM) + (NTR^* NTM'^* S)$$

Inverting the expression for P' yields:

$$P = ((O^* NEP'^* NTR^* NTM) + (NTR^* NTM'^* S))'$$

which may be implemented as an AOI (66 in FIG. 2).

A similar treatment for the N-driver yields the expression:

$$N = ((O + NEN + NTR' + NTM')^* (NTR' + NTM + S'))'$$

which may be implemented as an OAI (86 in FIG. 2).

Logic Implementation

To implement the logic equations described above, six logic signals are derived from various logical combinations of the two primary test control signals, tri-state (NTR) and latch (NTM). These signals, provided on bus 50, are defined in the following table:

TABLE 2

| BUS SIGNAL DEFINITIONS | | |
|---|---|---|
| SIGNAL NAME | LOGIC EQUATION | FUNCTION |
| DP = | NTR*NTM | P-enable normal data |
| SP = | NTR*NTM' | P-enable test data |
| NDN = | NTR' + NTM' | not-N-enable normal data |
| NSN = | NTR' + NTM | not-N-enable test data |
| LS = | NTM | latch test data |
| NLS = | NTM' | not-latch test data |

Based on these bus signals, each pad contains an AOI circuit (66) controlling the P driver with the equation:

$$P = ((O^* NEP'^* DP) + (SP^* S))'$$

and an OAI circuit (86) controlling the N-driver with the equation:

$$N = ((O + NEN + NDN)^* (S' + NSN))'$$

Figure 4:
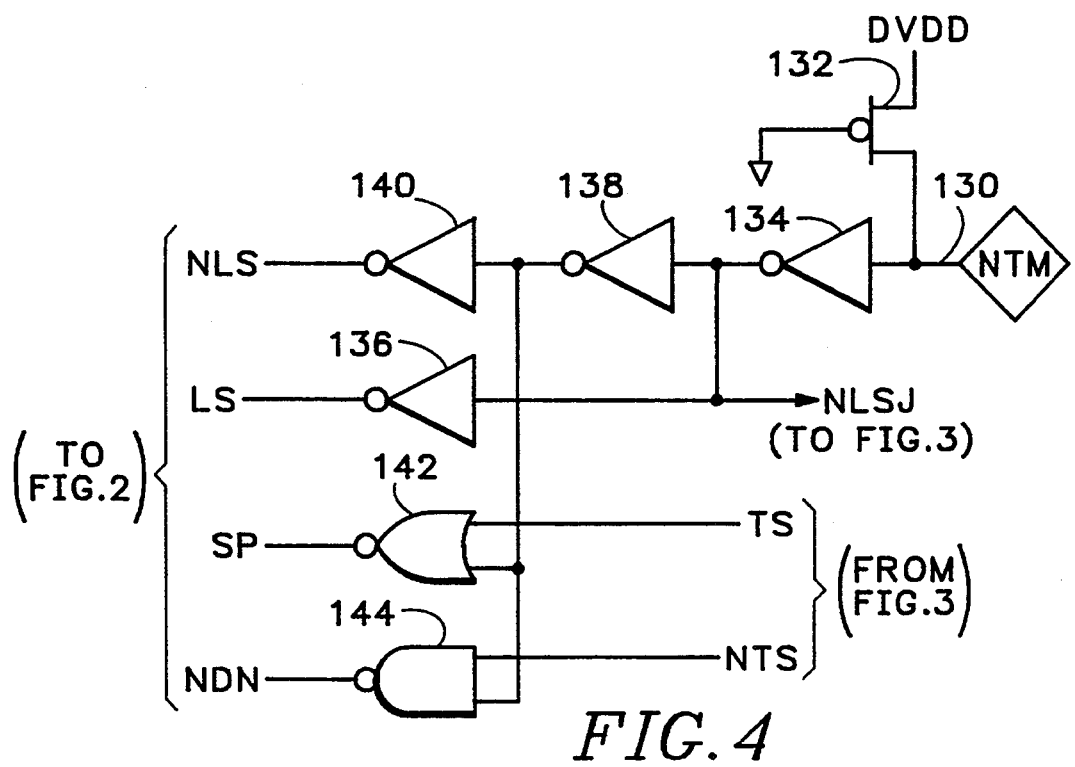
FIG. 4 is a schematic diagram of the latch (NTM) test control pad logic.

To optimize layout space, the logic functions required to generate the six bus signals from the two primary test control signals were assigned arbitrarily to the two test control pads as described below. Specifically, the tri-state (NTR) test pad logic, FIG. 3, provides bus signals DP and NSN and two intermediate logic signals NTS and TS. The latch (NTM) test pad logic, FIG. 4, provides the other four bus signals NLS, LS, SP and NDN, and an intermediate logic signal NLSJ. Note that in these figures NTS=NTR, TS=NTR' and NLSJ=NTM'. Furthermore, DeMorgan's theorem was applied to the bus signal equations above for NAND/NOR layout convenience.

Tri-state (NTR) pad logic (see FIG. 3):

$$DP = (TS + NTM')'$$
$$NSN = (NTS^* NTM')'$$

Latch (NTM) pad logic (see FIG. 4):

$$SP = (TS + NTM)'$$
$$NDN = (NTS^* NTM)'$$
$$LS = NTM$$
$$NLS = NTM'$$

Circuitry to implement these logic equations in a preferred embodiment is described next. The same or logically equivalent equations to achieve the same results may be implemented in various ways without departing from the present invention.

FIG. 3 is a schematic diagram of the tri-state (NTR) test pad logic. The NTR terminal, node 100 is coupled to DVDD through a pull-up transistor 102 to maintain NTR in a logic high state when not in use, as it is an active low signal. Node 100 is coupled through an inverter 104 to provide an intermediate logic signal TS. A NOR gate 108 combines logic signals TS and NLSJ (node 106) to form a logic signal DP. DP is one of the logic signals on bus 50. Another inverter 110 has its input coupled to node TS and its output provides another intermediate logic signal NTS which is logically equivalent to NTR.

A NAND gate 112 combines logic signals NTR and NLSJ to provide a logic signal NSN which is another one of the logic signals on bus 50. Logic signals DP and NSN form part of bus 50 for controlling the testable I/O pad.

Intermediate logic signals TS and its complement, NTS, are provided to the circuitry shown on FIG. 4, described below. Another pair of inverters 120, 122 are coupled to receive logic signals NTR and TS, respectively, to provide logic signals ITS and INTS, respectively. Logic signals ITS and INTS may be used to turn off pad pull-ups and pull-downs when NTR goes low (i.e., during tri-state) by either tying them directly to the pull-up/pull-down signals or by routing them through logic in the IC and then to the pull-up/pull-downs.

FIG. 4 is a schematic diagram of the NTM pad logic. The NTM terminal, coupled to node 130, receives the NTM logic signal. NTM is an active low latch signal used to latch test data into the latch of FIG. 2. Node 130 is coupled to a pull-up transistor 132 to maintain the pad high when it is not driven for test purposes. An inverter 134 is coupled to node 130 to provide logic signal NLSJ to FIG. 3. NLSJ is also coupled through an inverter 136 to provide a logic signal LS, which is logically equivalent to NTM. Another inverter 140 is coupled to the output of inverter 138 to provide logic signal NLS. Signals NLS and LS form part of bus 50 and are used to control the output of inverter 52 (FIG. 2) for writing into the latch of FIG. 2.

A NOR gate 142 combines logic signals NTM and TS (from FIG. 3) to provide logic signal SP. Conversely, a NAND gate 144 combines logic signals NTM and NTS (the complement of TS) to provide a logic signal NDN. Signals SP and NDN form part of bus 50.

Test Mode Operation

A typical test sequence utilizing the logic described above is as follows:

1) The NTR and NTM lines are normally held high.
2) The NTR line is driven low tri-stating the pads, and the test bits to be latched are presented on the pad inputs.
3) The NTM line is driven low to latch the test bit into the latch on each of the pads.
4) The NTR line is driven back high, causing the pads to drive out the inverse of the latched test bit which was driven in.
5) The NTM line is driven high to return the pads to normal operation.

The logic states of the control bus lines for this sequence are shown in Table 3, as follows:

TABLE 3

| TEST SEQUENCE | | | | | | | | |
|---|---|---|---|---|---|---|---|---|
| NTR | NTM | DP | SP | NDN | NSN | NLS | LS | Description |
| 1 | 1 | 1 | 0 | 0 | 1 | 0 | 1 | Normal operation |
| 0 | 1 | 0 | 0 | 1 | 1 | 0 | 1 | Tristate pins |
| 0 | 0 | 0 | 0 | 1 | 1 | 1 | 0 | Latch test data |
| 1 | 0 | 0 | 1 | 1 | 0 | 1 | 0 | Output inverse data |
| 1 | 1 | 1 | 0 | 0 | 1 | 0 | 1 | Normal operation |

Any number of I/O pads may be tested simultaneously under control of the NTR and NTM signals (subject to bus loading considerations). It is desirable to provide alternating ones and zeros to adjacent pins (I/O pad terminals) to check for short circuits between them.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. An I/O pad testing circuit for use in a digital integrated circuit for testing functionality of selected I/O pads, each selected pad having a corresponding terminal, the circuit comprising:

a first test control terminal for receiving an external tri-state logic signal (NTR) and a second test control terminal for receiving an external latch logic signal (NTM);

combinatorial logic means for tri-stating all of the selected I/O pads when the tri-state logic signal is asserted and the latch logic signal is not asserted for receiving a respective test bit applied to each of the selected I/O pad terminals;

combinatorial logic means for storing all of the test bits in response to assertion of the latch logic signal while the tri-state logic signal is asserted;

combinatorial logic means for driving a respective inverse of each stored test bit out of the corresponding terminal in response to the tri-state logic signal returning to its unasserted state; and combinatorial logic means for returning all of the selected I/O pads to normal operation in response to the latch logic signal returning to its unasserted state, whereby all of the selected pads are tested in parallel at high speed under control of the tri-state logic signal and the latch logic signal.

2. An I/O pad testing circuit according to claim 1 wherein said storing means includes, for each selected I/O pad, a pair of inverters cross-coupled so as to form a latch for storing the respective test bit, whereby an output side of the cross-coupled pair of inverters provides the inverse of the stored test bit, and further includes a tri-state logic gate connected between the terminal and the latch for controllably isolating the latch from the corresponding terminal.

3. An I/O pad testing circuit according to claim 2 wherein:

each selected I/O pad includes an output driver circuit for controllably driving the terminal;

the said logic means for tri-stating all of the selected I/O pads includes combinatorial logic means coupled to all of the output driver circuits for turning off the corresponding terminals when the tri-state logic signal is asserted and the latch logic signal is not asserted; and the said logic means for driving a respective inverse of each stored test bit out of the corresponding terminal includes logic means coupled to the output driver circuit and coupled to said output side of the corresponding latch so as to drive the corresponding terminal to the state of said inverse stored test bit in response to the tri-state logic signal returning to its unasserted state.

4. An I/O pad testing circuit according to claim 3 wherein each selected I/O pad output driver circuit includes:

a P-driver transistor coupled to the corresponding terminal and an N-driver transistor also coupled to the corresponding terminal, each driver transistor having a respective control gate (P,N);

an AOI circuit having an output coupled to the P-driver transistor control gate, the AOI circuit arranged for selectively gating one of a pad output signal (O) and the said inverse stored test bit (/S) to the said control gate (P) responsive to the states of the tri-state and latch logic signals; and an OAI circuit having an output coupled to the N-driver transistor control gate, the OAI circuit arranged for selectively gating one of a pad output signal (O) and the said inverse stored test bit (/S) said control gate (N) responsive to the states of the tri-state and latch logic signals.

* * * * *